United States Patent [19]

Adelman et al.

[11] Patent Number: 5,330,875
[45] Date of Patent: Jul. 19, 1994

[54] PROCESS FOR PRODUCING NEGATIVE AND POSITIVE ORIGINAL IMAGES ON A BILEVEL PRINTING PLATE UTILIZING NON-SILVER HALIDE LAYER AND SILVER HALIDE OVERLAYER

[75] Inventors: Michael W. Adelman, Ramsey; Robert W. Hallman, Palisades Park, both of N.J.; Suck-Ju Hong, Bronxville; Ken-Ichi Shimazu, Briarcliff Manor, both of N.Y.; Burton H. Waxman, Rockaway, N.J.

[73] Assignee: Sun Chemical Corporation, Fort Lee, N.J.

[21] Appl. No.: 57,592

[22] Filed: May 5, 1993

[51] Int. Cl.⁵ .................. G03F 7/095; G03F 7/30
[52] U.S. Cl. ................... 430/142; 430/156; 430/166; 430/264; 430/325; 430/326; 430/328; 430/329; 430/502; 430/503
[58] Field of Search ............... 430/156, 166, 264, 325, 430/326, 328, 329, 502, 503, 142

[56] References Cited

U.S. PATENT DOCUMENTS

| | | |
|---|---|---|
| 3,567,445 | 3/1971 | Atkinson et al. |
| 3,635,709 | 1/1972 | Kobayashi . |
| 4,283,478 | 8/1981 | Kubotera et al. .................. 430/156 |
| 4,299,912 | 11/1981 | Shiba et al. ......................... 430/302 |
| 4,341,856 | 7/1982 | Toyama et al. ..................... 430/156 |
| 4,348,471 | 9/1982 | Shelnut et al. ..................... 430/165 |
| 4,447,512 | 5/1984 | Rowe et al. .......................... 430/17 |
| 4,576,901 | 3/1986 | Stahlhofen et al. ................ 430/325 |
| 4,927,741 | 5/1990 | Garth et al. ......................... 430/309 |

Primary Examiner—Charles L. Bowers, Jr.
Assistant Examiner—Christopher G. Young
Attorney, Agent, or Firm—Jack Matalon

[57] ABSTRACT

A lithographic printing plate precursor and process for its utilization have been discovered through which negative and positive original images can be printably reproduced on the plate precursor in substantially fewer development steps. The precursor plate is exposed sequentially to either the negative or positive original with the resultant image subsequently developable in a single process or step. The process is achieved by using a precursor plate having two coatings of significantly different photographic sensitivity to light, i.e., speed as characterized by "camera speed" or "contact speed" and imagewise exposing the originals in sequence to alternative speeds. The contact speed coating may be negative-working or positive working while the camera speed coating is negative-working. The camera speed coating is developed followed by exposure of the contact speed coating. Images produced at camera speed are removed and non-image bearing portions of the contact speed coating are removed. The remaining image areas corresponding to the negative and positive originals are treated to provide positive printable images.

15 Claims, No Drawings

PROCESS FOR PRODUCING NEGATIVE AND POSITIVE ORIGINAL IMAGES ON A BILEVEL PRINTING PLATE UTILIZING NON-SILVER HALIDE LAYER AND SILVER HALIDE OVERLAYER

FIELD OF THE INVENTION

This invention relates to a lithographic printing plate which can be employed in the production of positive images from negative and positive originals. The invention also relates to a process for the formation of printable images on a lithographic plate from negative and positive originals employing a single development step. More specifically, the invention relates to a printing plate having a silver halide coating and a non-silver halide coating and to a process for producing printable images from negative and positive originals.

BACKGROUND OF THE INVENTION

The prepress operations associated with lithographic printing plate production are demanding and becoming increasingly complex. Depending on the demands and preferences of the customer, printers may be required to use both negative and positive original transparencies as the input materials to produce a finished plate. Additionally, the high quality of the finished plate must be maintained regardless of the type of original input and must be commensurate with the need to produce copies that may number in the millions. However, as a consequence of these increasing requirements, both unipolar and bipolar plates are now available to the printing industry so that a single negative or positive original (unipolar) or both negative and positive originals (bipolar) can be used as input for printing plate image production. Known unipolar plates comprise generally a single photosensitive layer on a hydrophilic substrate. Known bipolar plates comprise generally at least two photosensitive layers on a hydrophilic substrate and are known in the art as bilevel plates, referring to the two photosensitive layers.

Currently, if the printer uses a conventional unipolar plate such as a negative working or a positive working plate to reproduce a negative and a positive original, i.e., bipolar reproduction, one of the original input materials must be converted to suit the final plate mode. This is expensive and time consuming. If the printer resorts to the use of a bipolar plate as available in the art heretofore for reproduction of images from negative and positive originals, additional process steps in development, masking or exposure are invariably required which renders this alternative expensive and time consuming as well. The additional steps required in the present art of bipolar printing plate utilization flow from the fact that in order to obtain the requisite positive images on the final printing plate from a negative and a positive original input, a reversal of one of the original images needs to be accomplished during the photographic image transfer process.

Artisans in the photographic arts have found the problem of simplifying the production and lowering the cost of a lithographic printing plate produced from negative and positive originals to be a substantial challenge. A major objective of the instant invention is to effectively meet that challenge.

U.S. Pat. Nos. 4,576,901 and 4,581,321 disclose a process for producing negative copies by imagewise exposing a coating containing amide substituted 1,2-quinone diazides followed by heating, re-exposing and developing. The process permits the production of negative copies with the aid of a material which yields positive copies when it is processed in a conventional manner.

U.S. Pat. No. 4,927,741 discloses a process and apparatus for reversal processing to produce a negative of an original image on the plate. The printing plates is required to be exposed overall after heating. Exposure is carried out while the plate is conveyed through water.

U.S. Pat. No. 4,299,912 discloses a process for producing a lithographic printing plate using a plate containing two light sensitive layers, one of which is a gelatin-silver halide emulsion and the other is a nonsilver halide layer. The patent teaches the use of a proteolytic enzyme to aid in the removal of the gelatino layer after imagewise exposure followed by exposure of the non-silver halide layer.

U.S. Pat. No. 4,341,856 and 4,283,478 teach printing plates containing at least two light sensitive layers. Production of the final image containing printing plate entails at least two exposure steps.

U.S. Pat. Nos. 4,350,753 and 4,348,471 incorporated by reference teach positive acting printing plates having high pre-development image visibility, including positive coatings consisting of phenolic-Novolak resins. U.S. Pat. No. 3,635,709 incorporated herein by reference, teaches a positive acting lithographic printing plate wherein the light sensitive layer is a composition comprising an ester of 2-diazo-1-naphthol-4 (or-5)-sulfonic acid with a polyhydroxy phenol that is a condensation product of acetone and pyrogallol.

U.S. Pat. No. 3,567,445 incorporated by reference teaches a presensitized lithographic printing plate with two differentially spectrally sensitive layers separated by a Novolak resin. The base layer is of the type used in a negative-working presensitized lithographic plate while the top layer is a silver halide emulsion layer.

It is an object of the present invention to provide a process for the production of a lithographic printing plate containing printable images produced from negative and positive originals sequentially exposed before development of the plate.

Another object of the present invention is to provide a lithographic printing plate precursor having coatings sensitive to light of different exposure speed photographically processable according to the aforestated process.

As employed herein, the term printing plate precursor refers to a hydrophilic substrate having one or more light sensitive coatings or layers. The precursor plate is used to produce a lithographic printing plate useful in printing operations.

SUMMARY OF THE INVENTION

A lithographic printing plate precursor and process for its utilization have been discovered through which negative and positive original images can be printably reproduced on the plate precursor in substantially fewer development steps. The precursor plate is exposed sequentially to either the negative or positive original with the resultant image subsequently developable in a single process or step. The process is achieved by using a precursor plate having two coatings of significantly different photographic sensitivity to light, i.e., speed as characterized by "camera speed" or "contact speed" and imagewise exposing the originals in sequence to alternative speeds. The contact speed coating may be negative-working or positive working while the camera speed coating is negative-working. The camera speed coating is developed followed by exposure of the contact speed coating. Images produced at camera speed are removed and non-image bearing portions of the contact speed coating are removed. The remaining image areas corresponding to the negative and positive originals are treated to provide positive printable images.

More particularly, a process for producing a negative original image and a positive original image on a printing plate employing a single development step has been discovered. The process comprises providing a coated printing plate comprising a substrate having coated thereon a first positive-working, non-silver halide, light sensitive coating photoinsensitive to light at silver halide speeds and a second or top negative-working coating comprising silver halide emulsion. A first portion of the plate is exposed image-wise through a positive original at a high exposure speed, i.e. contact speed, sufficient to expose the first coating and second coating. Then, at a low exposure speed, i.e., camera speed, both a second portion of said plate is exposed image-wise through a negative original with nonimage-wise exposure of the first portion from the foregoing positive original image-wise exposure. The top coating is then developed. Next, the plate is subjected to an overall exposure at high exposure speed. The plate is then treated to remove exposed and unexposed residue of the second or top coating followed by treatment of the first coating to remove non-image containing areas of the first coating whereby a printing plate is produced containing images corresponding to the negative and positive originals.

In the process of the invention, the first coating may be a positive-working or a negative-working coating while the top or second coating is a negative working coating. The process of the invention for a plate having both the first and second coating negative-working proceeds as follows for a bilevel printing plate comprising a substrate having coated thereon a first negative-working, non-silver halide, light sensitive coating photoinsensitive to light at silver halide speeds and a second or top negative-working coating comprising silver halide emulsion:

At a low exposure speed, both a first portion of the plate is exposed image-wise through a positive original with nonimage-wise exposure of a second portion of plate. Then, at a high exposure speed second portion is exposed image-wise through a negative original. The top coat is developed followed by overall exposure of the plate at a high exposure speed. The plate is then treated to remove exposed and unexposed residue of said top coating and further treated to remove non-image containing areas of the first coating whereby a printing plate is produced containing images corresponding to the negative and positive originals.

For both processes described herein, the order of exposure, i.e., positive original first or negative original first is not critical. Either original may be exposed first.

The invention also includes a presensitized printing plate for sequentially producing a negative original image and a positive original image on a printing plate employing a single development step. The plate comprises a substrate having coated thereon a first non-silver halide, light sensitive coating photoinsensitive to light at silver halide exposure speeds and a second or top coating comprising silver halide emulsion, wherein the first coating is selected from the group consisting of diazo resins, diazide compounds, azide compounds, polymers having alpha, beta unsaturated carbonyl compounds in the main or side chain, and unsaturated monomers photopolymerizable by addition polymerization.

DETAILED DESCRIPTION OF THE INVENTION

The lithographic printing plate precursor of the present invention comprises a support or substrate upon which is coated a first coating comprising a non-silver halide coating sensitive to light at contact exposure speeds and a second or top coating comprising a silver halide emulsion sensitive to light at camera exposure speeds.

The term "camera speed" and "high speed" are interchangeably used herein. "Camera speed" or "high speed" means that the coating is sufficiently fast, i.e., photographically light sensitive, to be used in a camera such as a process camera and embodies focusing an original onto the light sensitive layer through an image-focusing lens. A high exposure speed or camera speed coating in the present invention has exposure speeds between 1 and 20 millijoules per square centimeter ($mj/cm^2$), but preferably about 5 $mj/cm^2$. For camera speed or high speed coatings a comparatively low energy level of light is all that is required to impinge upon the coating to produce a light induced chemical change in the coating and a corresponding photographic effect. "Contact speed" or low exposure speed as used herein, means that a light sensitive material can be exposed through a positive or negative transparency original placed in contact with it. Contact speed coatings used in the present invention have speeds between about 200 and 1000 $mj/cm^2$, but preferably about 400 $mj/cm^2$. Contact exposure speed or low speed coatings require substantially higher energy levels of light to impinge upon the coating to produce a chemical change in the coating and a corresponding photographic effect.

The support or substrate for the printing plate precursor of the invention may be any of those supports or substrates having a hydrophilic surface that are commonly used as supports in the manufacture of printing plates. Examples include hydrophilic metal plates such as aluminum, composite metal plates, plastic films, paper and the like.

The first coating on the substrate which comprises a non-silver halide coating sensitive to light at contact speeds yields a lipophilic image and includes light sensitive coatings conventionally used in light sensitive lithographic printing plates. The term lipophilic means that the image repels water for wetting in printing and receives oily ink. Examples of compositions constituting such light sensitive coatings are described in U.S. Pat. No. 4,299,912 and in the patents assigned to Polychrome Corp. and incorporated by reference herein before. They include by example without limitation: Compositions comprising one or more diazo resins; compositions comprising one or more o-naphthoquinonediazide compounds; compositions comprising one or more light sensitive azide compounds; compounds comprising one or more polymers containing an alpha, beta unsaturated carbonyl group in the main or side chain thereof; and photopolymerizable compositions comprising one or more addition polymerizable unsaturated compounds.

As used herein, by light sensitive first layer or coating capable of being used as the light sensitive layer in a negative-working presensitized printing plate is meant a layer which can be coated onto the base and which is sensitive to light such as ultra-violet light and when exposed to such through a negative in the exposed areas undergoes goes a chemical reaction which renders the exposed areas insoluble leaving the unexposed areas dissoluble. By light sensitive first layer or coating capable of being used as the light sensitive layer in a positive-working presensitized printing plate is meant any light sensitive composition that is sensitive to light such as ultraviolet light and when exposed to such light undergoes a chemical reaction in the exposed areas whereby the exposed areas become soluble and removable.

An example of a positive working resin composition which can be developed with an alkaline solution is one which contains a light sensitive material such as o-naphthoquinonediazide. Examples of negative working resin compositions which can be developed following UV light exposure include polyvinylcinnamate, vinyl polymers containing an aromatic azide group and the like. The photographic speed of these compounds is too slow for plates sensitized therewith to be of camera speed and thus, as previously stated, most presensitized lithographic plates are of contact speed.

U.S. Pat. Nos. 4,483,758 and 4,447,512 incorporated herein by reference, teach negative working compositions consisting of diazo resin based on diphenyl amine sulfate condensate with formaldehyde and isolated as 2-hydroxy-4-methoxy-benzophenone-5-sulfonic acid salt. Also included are polymers with alpha, beta unsaturated carbonyl groups in the main or side chain.

The top layer or coating of the lithographic plate precursor of the invention comprises any type of gelatin-silver halide emulsion depending on the original to be produced. Silver halide includes silver chloride, silver bromide, silver iodide and mixtures thereof as conventionally employed in the art. The average silver halide grain diameter is preferably between 0.01 $\mu$ and 5 $\mu$.

In order to provide a suitable or desired sensitivity to the silver halide, the grains thereof can be subject to chemical sensitization, e.g., sulfur sensitization, reduction sensitization, sensitization using salts of noble metals such as It, Rh, Pt, etc., or spectral sensitization using sensitizing dyes. Silver halides of the latent surface image type and inner latent image type can be used. The silver halide emulsion generally contains various additives as known in the art.

The gelatin-silver halide light sensitive emulsion layer is provided so that the dry weight is about 1 to about 10 g/m$^2$, preferably from 2 to 6 g/m$^2$.

The invention comprises a process to provide a bilevel printing plate precursor that can be developed in one step or stage to produce positive, printable images from both negative image input and positive image input material.

Positive-working Plate with Negative-working Emulsion

A preferred embodiment comprises a six-step process. A presensitized printing plate is provided containing a first positive-working light sensitive resin coating. The printing plate is then coated with a second coating comprising a negative-working light sensitive silver halide emulsion to provide a bilevel plate. The six process steps are carried on the bilevel plate.

In a first step, a first portion of the printing plate is exposed through a positive original at a high light energy level (about 400 mj/cm$^2$). The exposure results in a conversion of a corresponding portion of the silver halide emulsion to latent silver image and a conversion of a corresponding portion of the light sensitive resin to an alkali soluble resin. The unexposed area corresponds with the positive image in both the top and first coating.

In the next step, a second portion of the plate is exposed through a negative original at a substantially lower light energy level (about 5 mj/cm$^2$) and the positive exposed first portion of the plate is also exposed to the same low light energy level, thereby blocking or protecting the unexposed portion of the first coating in the first portion of the plate. Optionally, the positive exposed first portion of the plate can be masked and subsequently exposed to lower light energy level but it is preferred to carry out an overall exposure. This step creates a latent image of the negative original in the emulsion on the second portion of the plate while the unexposed portion of the emulsion on said first portion is also exposed. The low energy level is too low to convert the resin coating.

The entire plate is processed in a developer to develop the negative latent image in the emulsion of the second portion of the plate and the fogged area of the emulsion of the first portion. The developed negative image is fixed, resulting in removal of silver halide in the second portion area while metallic silver in the first and second portions of the emulsion remain unchanged. This step provides a silver coating in the top layer protecting the first portion overall and thus the unexposed portion of the first layer corresponding to the positive original image. In addition, a silver coating in the second portion which corresponds to the negative original image area covers or protects the first coating from subsequent exposure.

After the development step, the entire area of the plate is preferably exposed overall to a high light energy level of about 400 mj/cm$^2$. The exposure results in the conversion or exposure of the resin underneath the emulsion on the second portion of the plate except for that area of the resin directly underneath the image produced in the emulsion from the negative exposure.

Following overall exposure at high exposure speed the emulsion layer is removed by washing or other means well known to those skilled in the art leaving the resin layer containing exposed resin in the first and second portions and unexposed resin corresponding to the positive and negative image in the first and second portion of the plate.

Next, the exposed resin areas which contain, in one embodiment, carboxylic acids produced by exposure to light are removed by alkali treatment leaving only the resin containing areas corresponding to the positive and negative images. These areas are further processed by means known in the art such as heating to harden (baking), etc, for printing.

The process can be carried out by first exposing the plate to negative original input followed by positive input. For that option the process is modified to comprise a first image-wise exposing of a first portion of the plate through a negative original with nonimagewise exposing the second portion at low exposure speed sufficient to expose the second coating only. The next step comprises image-wise exposing the second portion using the positive original at high exposure speed sufficient to expose the first and second coating. Subsequent processing follows the development, post-exposure and treatment steps described above.

Negative-working Plate with Negative-working Emulsion

Another preferred embodiment of the invention is to employ a presensitized printing plate having a first negative-working light sensitive resin coating. The printing plate is then coated with a second coating comprising a negative-working light sensitive silver halide emulsion to provide a bilevel plate. The process steps in this embodiment are depicted as follows for initial optional exposure through a positive original:

Exposing at a low exposure speed both a first portion of the plate image-wise through a positive original and nonimage-wise exposure of a second portion of said plate. This provides a latent image overall on the second coating except for that portion of the first portion corresponding to the positive image.

Next, exposing at a high exposure speed the second portion image-wise through a negative original. This converts the first coating as well as converting the second coating to latent silver image, both in an area corresponding to the negative image.

Following this, the entire plate is processed in a developer to develop the negative latent image in the emulsion of the first portion of the plate and the fogged area of the emulsion of the second portion. This step provides a silver coating in the top layer protecting the first portion non-image area and thus the unexposed portion of the first layer corresponding to the non-image area of the positive original. In addition, a silver coating in the second portion overall protects the first coating non-image area from subsequent exposure.

After the development step the entire area of the plate is preferably exposed overall to a high light energy level of about 400 mj/cm$^2$. The exposure results in the conversion or exposure of the resin underneath the second coating on the first portion of the plate except for that non-image area of the resin protected by metallic silver portions of the second coating.

Following overall exposure at high exposure speed the emulsion layer is removed by washing or other means well known to those skilled in the art leaving the resin layer containing unexposed resin in the first and second portions and exposed resin corresponding to the positive and negative image in the first and second portion of the plate.

Next, the unexposed resin areas are removed by leaving only the resin containing areas corresponding to the positive and negative images. These areas are further processed by means known in the art such as heating to harden, etc, for printing.

Here again the order of exposure of the plate comprising a negative-working first coat with negative-working top coat can be varied to expose the plate through a negative original first at low exposure speed rather than through a positive original at low exposure speed. This variation of the process proceeds as follows:

Exposing image-wise at a high exposure speed through a negative original a first portion of the plate and then exposing at a low exposure speed both the second portion of said plate image-wise through a positive original and nonimage-wise exposure of the first portion of the plate. Subsequent processing follows the development, postexposure and treatment steps described above for the negative-working first coating and negative-working second coating case.

The following Examples 1-4 describe various embodiments of the present invention:

EXAMPLE 1

Polychrome positive plate T-40, described in U.S. Pat. Nos. 4,350,753 and 4,283,478, was overcoated by a "roomlight" handling silver halide negative emulsion, Polychrome DLC, day light contact emulsion useful under white light conditions. The plate was exposed for 5 mj/cm$^2$ in contact with a negative original using a Berkey Ascor exposure frame. Part of the area not covered by the negative was contacted with a positive transparency while the area of the plate previously covered by the negative original was masked to avoid secondary exposure. An exposure of 400 mj/cm$^2$ was then given to the plate. The plate was then processed in a rapid access silver halide development solution (batch developer PRB 127) for negative or positive emulsions, and Polychrome fixer PF200. The plate was then given overall UV exposure, silver emulsion was removed by warm water and processed in conventional positive plate chemistry, i.e. Polychrome's positive developer 3000 and Gum PC963. The plate exhibited excellent positive image both from the negative original portion and positive original portion.

EXAMPLE 2

Polychrome positive plate known as "Posiimatte", described in U.S. Pat. Nos. 4,350,753 and 4,283,478, was overcoated by Polychrome silver halide emulsion PQF. The plate was exposed on the Opticopy Imposer II (Polychrome System Inc.) using negative transparency as originals with exposure ranging from 1 to 10 seconds to the Imposer light source of pulsed Xenon lamps attenuated by a series of filters to give the green portion of the light spectrum. The exposed areas were fully masked by masking sheets. The open areas requiring positive transparency input were contacted with the transparency and were given UV exposure to fully expose Posimatte. The transparency was removed and the plate was briefly given an overall (visible light) exposure to uniformly expose the coating not covered by the previous negative exposure. The plate was then developed, fixed, re-exposed, emulsion removed and processed in positive plate developer to give a plate bearing positive image of both negative input and positive input.

EXAMPLE 3

Polychrome positive plate T-40 was overcoated with Polychrome laser scanner emulsion RSF for ion-argon laser and containing sensitizing dyes. The plate was exposed on Gerber Scientific laser exposing system LE 55 to give text portion of image information along with a blank exposure to the area where the picture and graphic elements were to be inserted. The plate was then exposed in contact with a masking sheet with picture and graphic elements pasted in. Following development, fixing, reexposure, washing and development, the plate exhibited both text and graphic elements ready for high quality printing.

EXAMPLE 4

Polychrome negative working plate Vistar M, described in U.S. Pat. Nos. 4,483,758 and 4,447,512, is overcoated by a room light handling silver halide negative emulsion, DLC. The plate is exposed for 5.0 mj/cm$^2$ in contact with a positive original using a Berkey Ascor exposure frame. Part of the area not covered by the positive is contacted with a negative transparency. An exposure of 400 mj/cm² is given to the plate, while the area of the plate previously covered by the positive original is masked to avoid secondary exposure. The plate is then processed in a rapid access silver halide development solution, i.e., PRB127, and further processed as in Example 1.

The progress in digital technology enabled printers to use digital direct platemakers. High speed of text printing provides considerable productivity improvements over the conventional analog mode of plate preparation. In case of the graphics and pictures, however, the requirements for high level of memory and computing speed are such that the system becomes not only costly but slow to generate high quality images at reasonable speed.

The bimodal plate and the process proposed not only eliminates such inconveniences as additional film making but also improves productivity substantially by allowing various mode of transparencies and signals as the original input. In conventional analog contact method, both negative and positive originals can produce equally excellent images. In case of digital application, high speed texts can be laser imaged while pre-prepared graphics and picture elements can be contact exposed taking advantages of high speed digital generation of texts and high rate of information transfer of prepared graphics of high memory requirements.

What is claimed is:

1. A process for producing a negative original image and a positive original image on a printing plate employing a single stage silver halide development step, said process comprising;
   (a) providing a coated printing plate comprising a substrate having coated thereon a first positive-working, non-silver halide, light sensitive coating photoinsensitive to light at silver halide speeds and a second or top negative-working coating comprising silver halide emulsion;
   (b) exposing a first portion of said plate image-wise through a positive original at a high light energy level sufficient to expose said first coating and second coating;
   (c) exposing at a low light energy level both a second portion of said plate image-wise through a negative original and nonimage-wise exposure of said first portion from step (b), said first and second portions comprising different parts of said plate;
   (d) developing said top coating after step (c);
   (e) exposing said plate from step (c) overall at a high light energy level;
   (f) treating said plate after step (e) to remove exposed and unexposed residue of said second coating;
   (g) treating said first coating after step (f) to remove non-image containing areas of said first coating whereby a printing plate is produced containing images corresponding to said negative and positive originals.

2. The process of claim 1 including the further step of treating step (g) images corresponding to said negative and positive originals to harden and stabilize them for multiple printing operations.

3. The process of claim 1 wherein step (b) comprises image-wise exposing said first portion using said negative original and nonimage-wise exposing said second portion at low exposure speed sufficient to expose said second coating only; step (c) comprises image-wise exposing said second portion using said positive original at high exposure speed sufficient to expose said first and second coating.

4. The process of claim 1 wherein said first coating comprises o-naphthoquinonediazide.

5. The process of claim 1 wherein said low light energy level is between 1 and 20 mj/cm².

6. The process of claim 5 wherein said low level is preferably about 5 mj/cm².

7. The process of claim 1 wherein said high light energy level is between 200 and 1000 mj/cm².

8. The process of claim 7 wherein said high level is preferably about 400 mj/cm².

9. A process for producing a negative original image and a positive original image on a bilevel printing plate having a first negative-working non-silver halide coating and a second or top negative-working silver halide coating, said process comprising;
   (a) providing said bilevel printing plate comprising a substrate having coated thereon a first negative-working, non-silver halide, light sensitive coating photoinsensitive to light at silver halide speeds and a second or top negative-working coating comprising silver halide emulsion;
   (b) exposing at a low light energy level both a first portion of said plate image-wise through a positive original and nonimage-wise exposure of a second portion of said plate, said first and second portions comprising different parts of said plate;
   (c) exposing at a high light energy level said second portion image-wise through a negative original;
   (d) developing said top coating after step (c);
   (e) exposing said plate from step (c) overall at a high light energy level;
   (f) treating said plate after step (e) to remove exposed and unexposed residue of said top coating;
   (g) treating said first coating after step (f) to remove non-image containing areas of said first coating whereby a printing plate is produced containing images corresponding to said negative and positive originals.

10. The process of claim 9 including the further step of treating step (g) images corresponding to said negative and positive originals to harden and stabilize them for multiple printing operations.

11. The process of claim 9 wherein said low light energy level is between 1 and 20 mj/cm².

12. The process of claim 11 wherein said low light energy level is about 5 mj/cm².

13. The process of claim 9 wherein said high light energy level is between 200 and 1000 mj/cm².

14. The process of claim 13 wherein said light energy level is about 400 mj/cm².

15. The process of claim 9 wherein step (b) comprises exposing image-wise at a high light energy level through a negative original said second portion and step (c) comprises exposing at a low light energy level both said first portion of said plate image-wise through a positive original and nonimage-wise exposure of said second portion of said plate.

* * * * *